(12) United States Patent
Warren et al.

(10) Patent No.: US 7,718,892 B2
(45) Date of Patent: May 18, 2010

(54) CONTROL MODULE HOUSING

(75) Inventors: Gary Warren, Aurora (CA); Steven Steane, Courtice (CA); Darren Van Roon, Bowmanville (CA); Allan Cormack, Whitby (CA)

(73) Assignee: Flextronics Automotive Inc., Milpitas, CA (US)

( * ) Notice: Subject to any disclaimer, the term of this patent is extended or adjusted under 35 U.S.C. 154(b) by 322 days.

(21) Appl. No.: 11/783,126

(22) Filed: Apr. 6, 2007

(65) Prior Publication Data

US 2008/0245544 A1 Oct. 9, 2008

(51) Int. Cl.
*H02G 3/08* (2006.01)

(52) U.S. Cl. .......................... 174/50; 174/520; 439/76.1; 439/76.2; 248/906; 248/222.51; 361/801

(58) Field of Classification Search .................... 174/50, 174/520, 17 R, 53, 57, 58, 59; 439/76.1, 439/76.2, 949, 467; 248/906, 22.51, 221.11, 248/222.12, 222.52, 222.11, 200, 205.1, 248/222.51; 220/3.2–3.9, 4.02; 361/600, 361/679.01, 796, 801, 807, 730, 740

See application file for complete search history.

(56) References Cited

U.S. PATENT DOCUMENTS

| | | | |
|---|---|---|---|
| 4,818,010 A | 4/1989 | Dillon | |
| 5,398,157 A * | 3/1995 | Paul | 248/221.11 |
| 5,619,074 A | 4/1997 | Berch | |
| 5,950,973 A * | 9/1999 | Verma | 248/222.51 |
| 6,126,458 A * | 10/2000 | Gregory et al. | 439/76.2 |
| 6,176,735 B1 * | 1/2001 | Kawaguchi | 439/467 |
| 6,441,304 B1 * | 8/2002 | Currier et al. | 174/53 |
| 6,570,088 B1 * | 5/2003 | Depp et al. | 174/50 |
| 6,574,117 B1 | 6/2003 | Lebo | |
| 6,833,503 B2 * | 12/2004 | Lopez et al. | 174/50 |
| 7,232,950 B2 * | 6/2007 | Kaneko et al. | 174/50 |
| 7,507,094 B2 * | 3/2009 | Kubota et al. | 439/76.2 |

* cited by examiner

*Primary Examiner*—Angel R Estrada
(74) *Attorney, Agent, or Firm*—Patton Boggs LLP

(57) ABSTRACT

A housing unit for securing electronics of a control module to a vehicle may include a housing and at least two connection members. The connection members connected to the housing may be adapted to engage an adaptor member (e.g., bracket) configured to be secured to a vehicle. The connection members may include at least one connection member configured to hook into the adaptor member and at least one connection member configured to snap into the adaptor member. Protrusion(s) may be included on the connection member(s) and be configured to contact the adaptor member to substantially eliminate transverse movement of the housing. The protrusion(s) may be crush-rib(s). The housing may include features to position, support, and minimize vibration of the electronics, where the electronics maybe disposed on a printed circuit board (PCB).

25 Claims, 9 Drawing Sheets

CONTROL MODULE HOUSING

BACKGROUND OF THE INVENTION

Vehicle control modules control various aspects of a vehicle, including controlling moving parts, such as seats, windows, and rotational closure members, such as lift gates. One of the issues that designers of control modules face includes securing the electronics of the control modules within the vehicle. Generally, designers use control module housings to house and secure the control modules.

Control module housings face a number of challenges for securing electronics therein. Control housings are to be adapted for connection to the automobile and prevent damage to the electronics over extended periods of time and over a variety of environmental conditions, such as heat and moisture, and motion factors. In the case of the control module housing being mounted to moving parts of a vehicle, including doors and lift gates, the housing should be designed to prevent motion, including vibration and other dynamic stress factors, from damaging control electronics contained therein as damage may cause vehicle parts to malfunction that are controlled by the control modules. Accordingly, there is a need for a housing to prevent damage to control modules contained within the housing.

SUMMARY

To overcome the problems of control modules being damaged while operating within a vehicle, the principles of the present invention provide for a housing that may be configured to be easily installed, minimize vibration due to loose fittings, provide for easy installment of the electronics within the housing, and substantially eliminate the ability for water to enter the housing. One embodiment of the housing may include a housing unit for securing electronics of a control module to a vehicle may include a housing and at least two connection members. The connection members connected to the housing may be adapted to engage an adaptor member (e.g., bracket) configured to be secured to a vehicle. The connection members may include at least one connection member configured to hook into the adaptor member and at least one connection member configured to snap into the adaptor member. Protrusion(s) may be included on the connection member(s) and be configured to contact the adaptor member to substantially eliminate transverse movement of the housing. The protrusion(s) may be crush-rib(s). The housing may include features to position, support, and minimize vibration of the electronics, where the electronics may be disposed on a printed circuit board (PCB).

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE DRAWINGS

Figure 1:
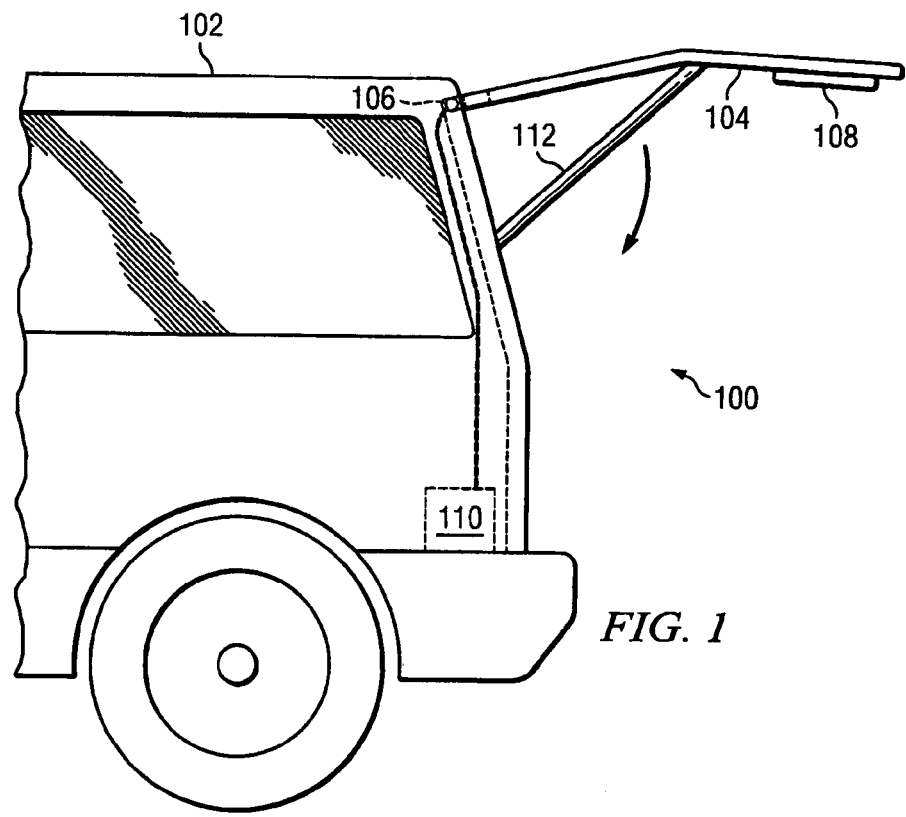
FIG. 1 is an illustration of an exemplary rear portion of a vehicle having a device configured to be repositioned, such as a rotational closure system.

FIG. 1 is an illustration of an exemplary rear portion of a vehicle 100 having a device configured to be repositioned, such as a rotational closure system. The vehicle 100 includes a vehicle body 102 and rotational closure system that includes a lift gate 104, hinge 106 that couples the lift gate 104 to the vehicle body 102, control module 108, motor 110, and cylinder 112. The control module 108 may be in communication with the motor 110 for controlling operation of the lift gate 104. The control module 108 may include processor (not shown) that executes software for controlling speed and position of the lift gate 104 and an angle sensor (not shown) that provides a feedback angle signal for the processor to control the motor 110 that opens and closes the lift gate 104. In one embodiment, the motor 110 is pneumatic. Alternatively, the motor 110 may be hydraulic, electromechanical or other type of motor as understood in the art. The control module 108 is shown to be connected to the lift gate 104. However, it should be understood that the control module 108 may be disposed in any other location of the vehicle. It should also be understood that the control module 108 may be utilized to control a different device within the vehicle, such as a motorized seat or window. The control module 108 may be virtually any electronic module, on a circuit board or otherwise, that an automotive manufacturer uses to power a device (e.g., radio, DVD player), control motion of a vehicle component (e.g., window, door), or perform any other functional operation.

Figure 2:
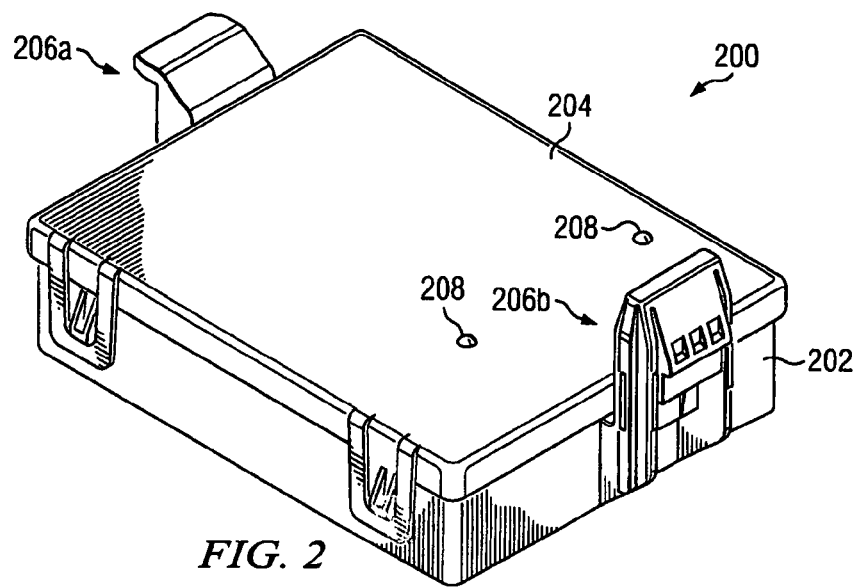
FIG. 2 is an illustration of a housing used for housing a control module for controlling a device configured to be repositioned.

FIG. 2 is an illustration of a housing 200 used for housing a control module for controlling a device configured to be repositioned. The housing 200 may include a housing base 202 and housing lid 204 configured to engage the housing base 202. The housing base 202 and housing lid 204 may include connection mechanism(s), such as clasps, snaps, screws, etc., to secure the two housing components together, as understood in the art. The housing 200 may include two or more connection members 206a-206b (collectively 206). In one embodiment, the connection members 206 may be connected to the housing base 202. For example, the connection members 206 may connect to and extend along side walls of the housing base 202 and extend substantially perpendicularly from the housing base. Alternatively, the connection members 206 may connect to the bottom of the housing base 202 and extend along the side walls. Alternatively, the connection members 206 may be integral with the housing base 202 (i.e., formed of the same material at the same time by the same process). In another embodiment, the connection members 206 may be connected to the housing lid 204. Still yet, another embodiment may provide for the housing base 202 and housing lid 204 to be a single component having a plastic hinge formed therebetween. The connection members may be formed of plastic, metal, or other material, such as fabric capable of being tightened during installation, and be connected to the housing base 202 with fasteners, such as screws, bolts, or otherwise.

Figure 3:
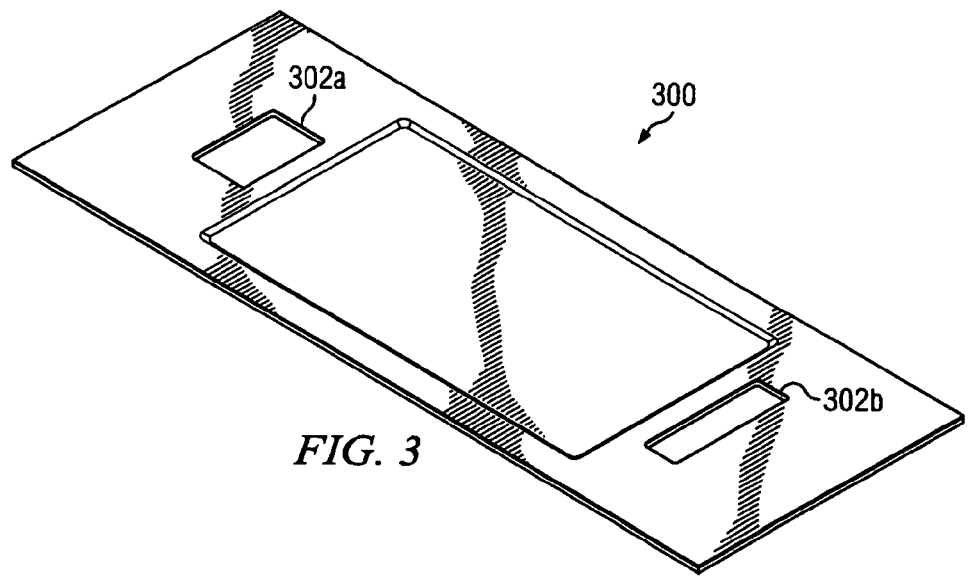
FIG. 3 is an illustration of an exemplary adaptor member for coupling the housing of FIG. 2 to a vehicle.

The connection members 206 may perform the same or different functions, for example, as shown, connection member 206a is configured in a "dog-leg" shape for hooking into an adaptor member, such as a bracket (FIG. 3). The connection member 206b may be configured with a snap feature for engaging an adaptor member. It should be understood that other and/or different configurations of connection members may be included with the housing 200 for mounting the housing 200 into a vehicle. The housing lid 204 may additionally include one or more stand-off bump features 208 for use in engaging another component, such as a bracket, as further described herein with regard to FIG. 12. It should further be understood that the terms housing base and housing lid are two members of a housing and may be connected in a vertical or horizontal manner. If the housing is formed of a housing base and lid that are side-by-side, the adaptor members may be connected to the different members. Furthermore, a housing unit may be considered a housing having connection members connected thereto.

FIG. 3 is an illustration of an exemplary adaptor member for coupling the housing of FIG. 2 to a vehicle. The adaptor member 300 may be a bracket and include openings 302a-302b (collectively 302) for enabling the connection members 206 to engage the adaptor member 300. Although not shown, the adaptor member 300 may define holes, such as screw holes, for connecting the adaptor member to a vehicle. Alternatively, the adaptor member 300 may be adhered to or otherwise connected to the vehicle.

Figure 4A:
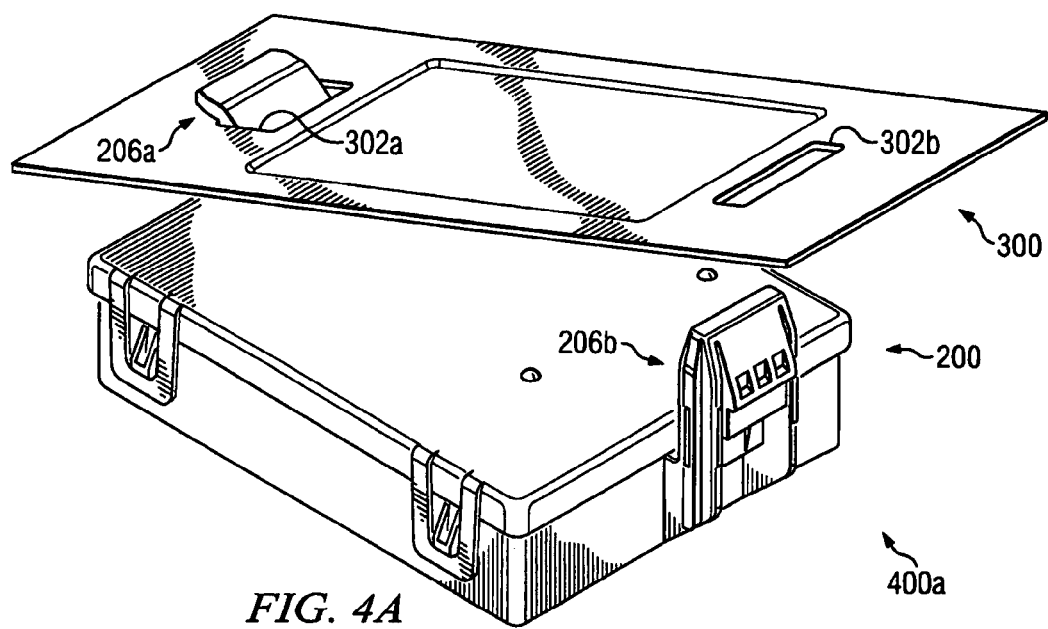
FIGS. 4A-4C are illustrations of an exemplary housing in the process of being engaged with an adaptor member for securing to a vehicle.
Figure 4B:
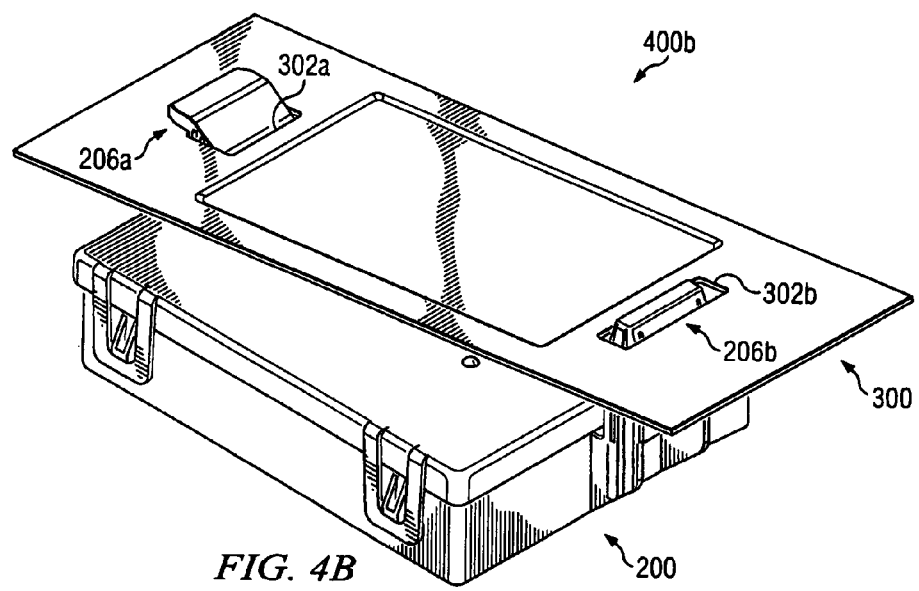
Figure 4C:
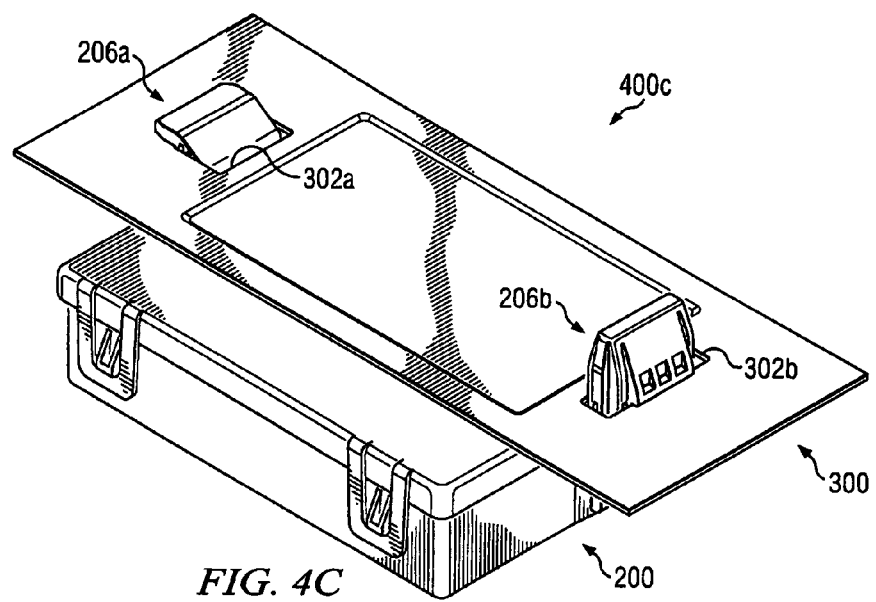

FIGS. 4A-4C are illustrations of an exemplary housing in the process of being engaged with an adaptor member for securing to a vehicle. As shown, the connection member 206a extends through the opening 302a and engages the adaptor member 300. This engagement of the "dog-leg" connection member 206a enables the adaptor member 300 to pivot about the connection member 206a so that the opening 302b aligns with the connection member 206b.

FIG. 4B is an illustration of a second stage configuration 400b of the housing 200 being configured with adaptor member 300. As shown, the adaptor member 300 has been pivoted or rotated about the connection member 206a such that the connection member 206b has begun to enter the opening 302b of the adaptor member 300.

FIG. 4C shows a next stage configuration 400c where the adaptor member 300 is fully engaged with the connection member 206b. In one embodiment, the connection member 206b creates a "snap" sound when fully engaged with the opening 302b of the adaptor member 300. At this point, the housing 200 and adaptor member 300 are secured with one another. To disconnect the housing 200 from the adaptor member 300, the connection member 206b may be pressed to disengage the connection member 206b from the opening 302b. While the connection process of the housing 200 and adaptor member 300 has been described as the adaptor member 300 being moved with respect to the housing 200, it should be understood that if the adaptor member 300 is already connected to a vehicle that the housing 200 is to be moved with respect to the adaptor member 300 being in a fixed position.

Figure 5:
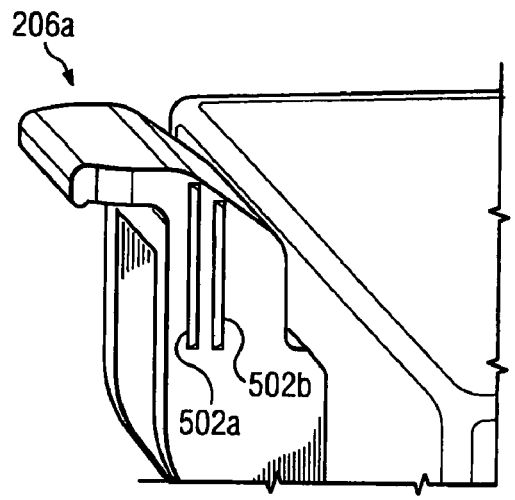
FIG. 5 is an illustration of a connection member including exemplary protrusions.

FIG. 5 is an illustration of a connection member including exemplary protrusions 502a-502b (collectively 502). As shown, the connection member 206a includes protrusions 502 that may operate to contact an adaptor member to increase vibration stability (i.e., dampen vibration). The protrusions 502 may be crush-ribs that are composed of plastic, rubber, or other resilient material Although shown as multiple protrusions 502, it should be understood that one or more protrusions 502 may be utilized. The protrusions 502 may be disposed on both sides of the connection member 206a to substantially eliminate vibration between two stiff materials (e.g., the material of the connection member 206a and adaptor member 300 (see FIG. 4C). Still yet, the protrusions 502 may have any size, shape, and configuration that is capable of contacting the adaptor member and provide for dampening and minimizing movement while mounted to a vehicle. By dampening vibrations, electronics, connectors, and other devices are better protected from potential damage or loosening during vehicle operation. In addition, dampening vibrations helps reduce vehicle noise to benefit comfort of passengers within the vehicle.

Figure 6:
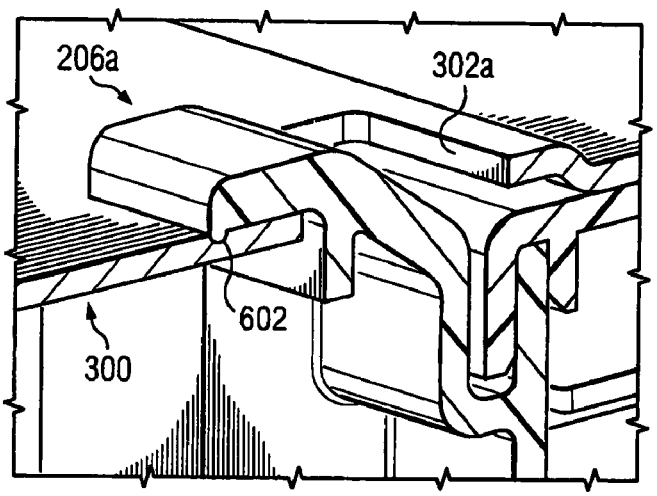
FIG. 6 is an illustration of a connection member having a stand-off rib.

FIG. 6 is an illustration of a connection member 600 having a stand-off rib 602. As shown, the standoff rib 602 maybe disposed on a portion of the connection member 206a that contacts the adaptor member 300. The standoff rib 602 allows a single edge to apply positive feedback against the adaptor member 300 to ensure an interference fit. The standoff rib 602 may be composed of a resilient material, such as rubber. While there is one standoff rib 602 shown, it should be understood that more than one standoff rib may be utilized in accordance with the principles of the present invention.

Figure 7:
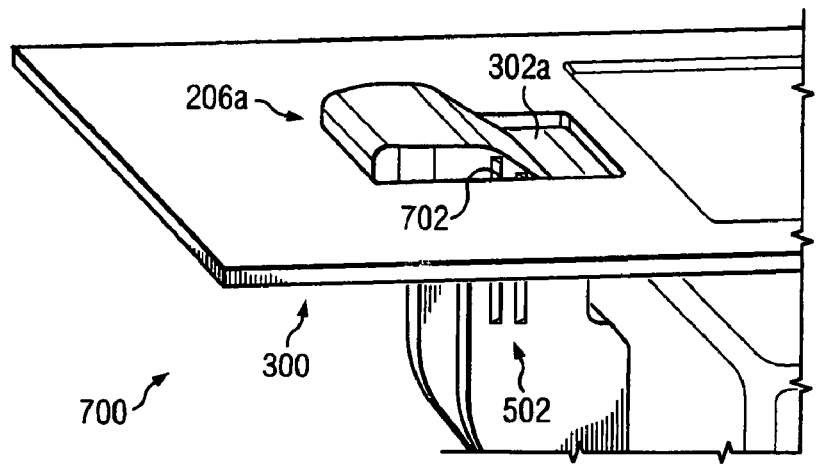
FIG. 7 is an illustration of an exemplary connection member formed in the shape of a "dog-leg" engaged with an adaptor member.

FIG. 7 is an illustration of an exemplary connection member 206a formed in the shape of a "dog leg" engaged with an adaptor member 300. The connection member 206a includes crush-ribs 502 that contact the adaptor member 300 at an interface 702. As previously described, the crush-ribs 502 may be compressed, although not fully, to absorb shock and vibrations and substantially eliminate translation motion applied to the housing via the adaptor member 300 by a vehicle.

Figure 8:
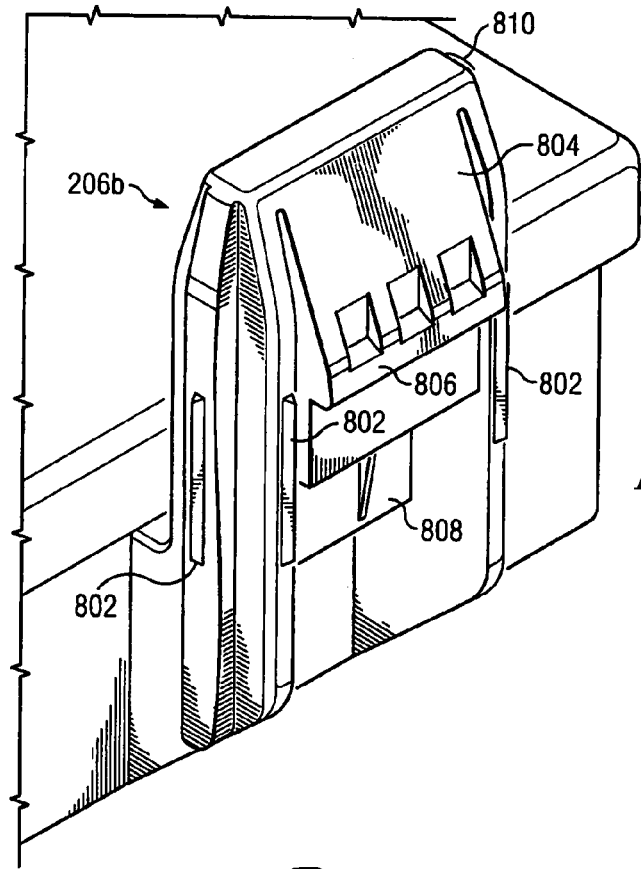
FIG. 8 is an illustration of an exemplary connection member having alignment crush-ribs disposed thereon.

FIG. 8 is an illustration of an exemplary connection member 206b having alignment protrusions 802 disposed thereon. The alignment protrusions 802 maybe crush-ribs and be used to guide the connection member 206b during engagement with an adaptor member (see FIGS. 4A-4C) and contact the adaptor member 300 to dampen vibrations. The connection member 206b may include a snap arm 804 that is used to engage adaptor member 300. The snap arm 804 may be configured such that when the connection member 206b extends through the adaptor member 300, the snap arm 804 prevents the housing from pulling away from the adaptor member 300 due to a ridge feature 806 extending from the snap arm 804. The snap arm 804 further includes a user-release feature 808 on the opposite side of the ridge feature 806 from an end 810 of the snap arm 804. The snap arm 804 may be compressed by a user who pushes on the user-release feature 808, thereby enabling the ridge feature 806 to disengage from an adaptor member into which the snap arm 804 is inserted.

Figure 9:
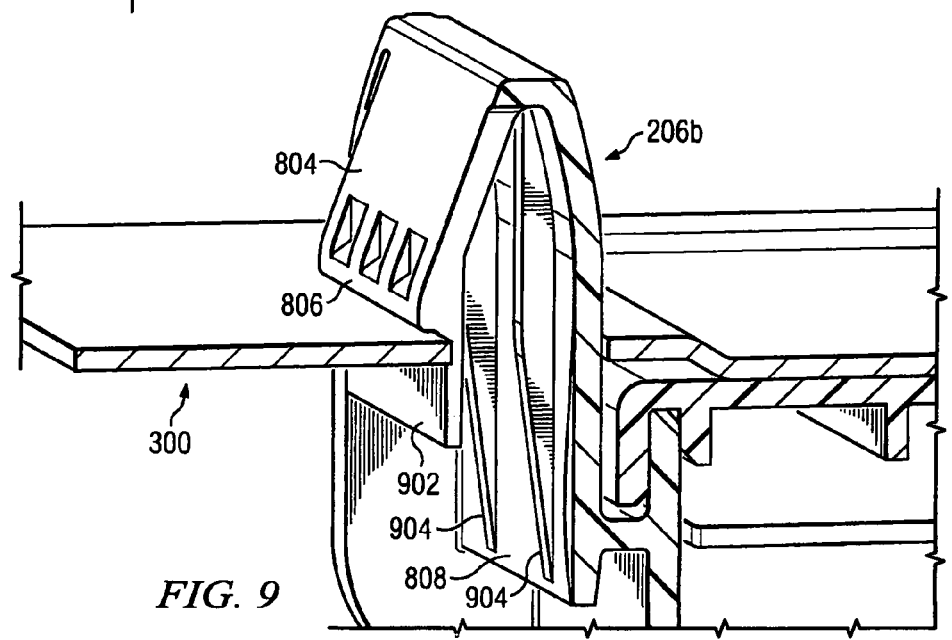
FIG. 9 is an illustration of an exemplary connection member having snap arm engaged with adaptor member.

FIG. 9 is an illustration of an exemplary connection member 206b having snap arm 804 engaged with adaptor member 300. As shown, the ridge feature 806 engages the adaptor member 300 at engagement region 902 such that when the snap arm 804 is fully inserted into an opening of the adaptor member 300 configured to receive the connection member 206b, the ridge feature 806 prevents the adaptor member 206b from being pulled out of the opening. A user may press on the user-release feature 808 to compress the snap arm 804 so that the ridge feature 806 disengages from the engagement region 902 of the adaptor member 300. To prevent the snap arm 804 from breaking or otherwise being deformed during disengagement operation, one or more snap-stop ribs 904 or other stop features may be provided on the connection member 206b. It should be understood that the snap arm is exemplary and that any other configuration may be utilized to secure and prevent the connection member 206b from releasing from the adaptor member 300.

Figure 10:
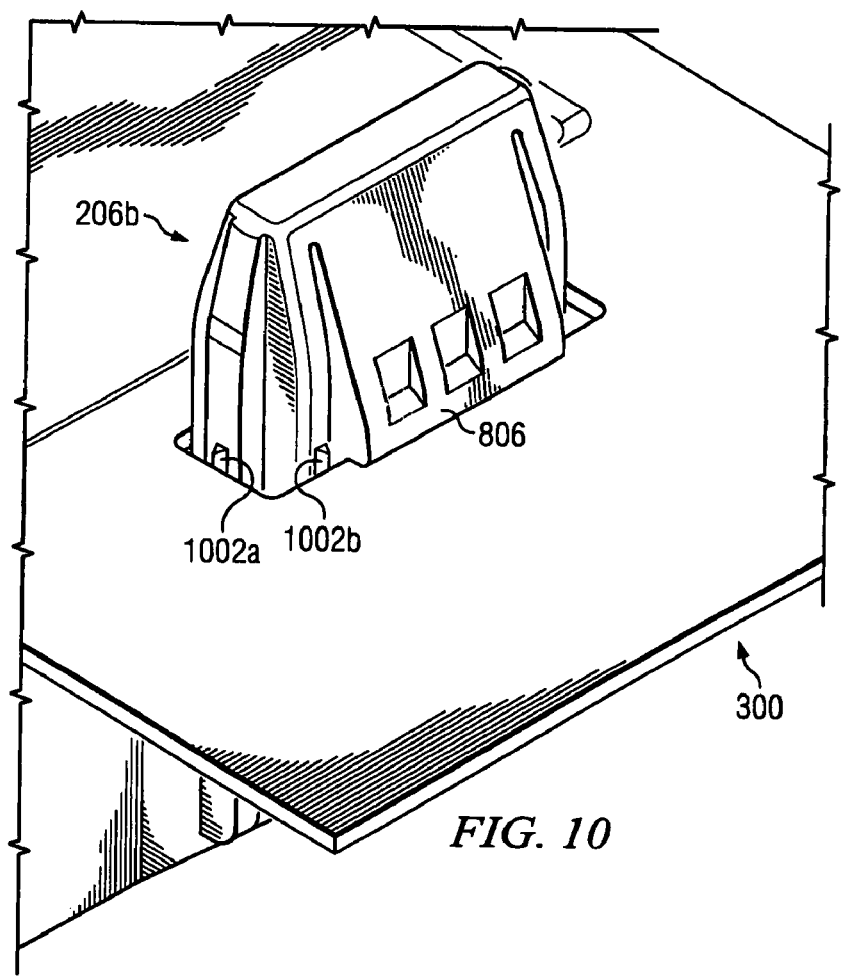
FIG. 10 is an illustration of an exemplary connection member engaged with an adaptor member.

FIG. 10 is an illustration of an exemplary connection member 206b engaged with an adaptor member 300. While the ridge feature 806 prevents the housing from being removed in a vertical or otherwise perpendicular direction from the adaptor member 300, one or more crush-ribs 1002a-1002b (collectively 1002) maybe used to restrict movement in the transverse or rotational directions, thereby ensuring vibration stability. In one embodiment, crush-ribs 1002 are located on both sides of the connection member 206b. It should be understood that crush-ribs 1002 may be disposed anywhere along the connection member 206b to contact the adaptor member 300 when the connection member 206b is engaged with the adaptor member 300.

Figure 11A:
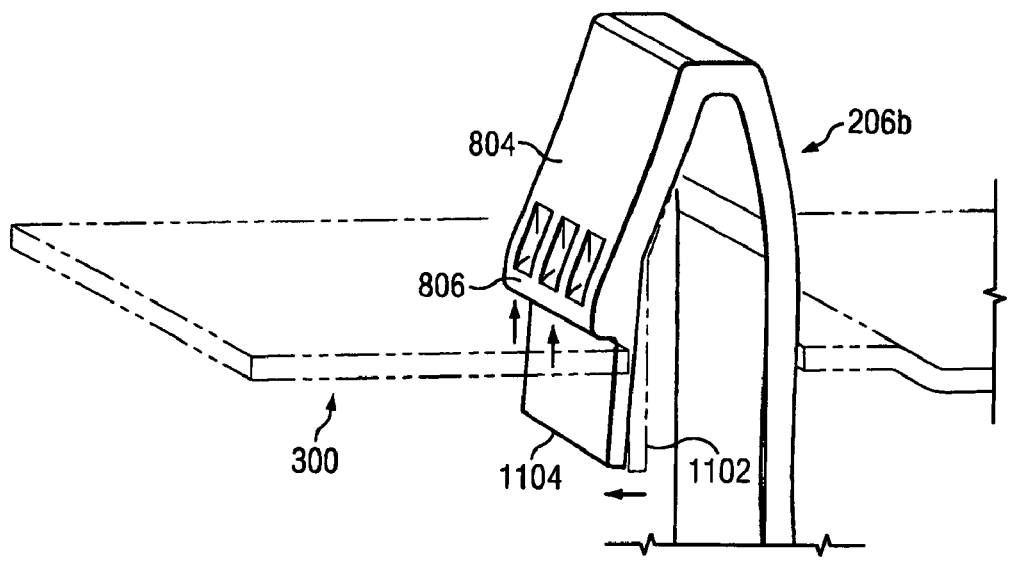
FIGS. 11A-11B are illustrations showing a connection member with an exemplary snap arm in engagement and non-engagement positions, respectively.
Figure 11B:
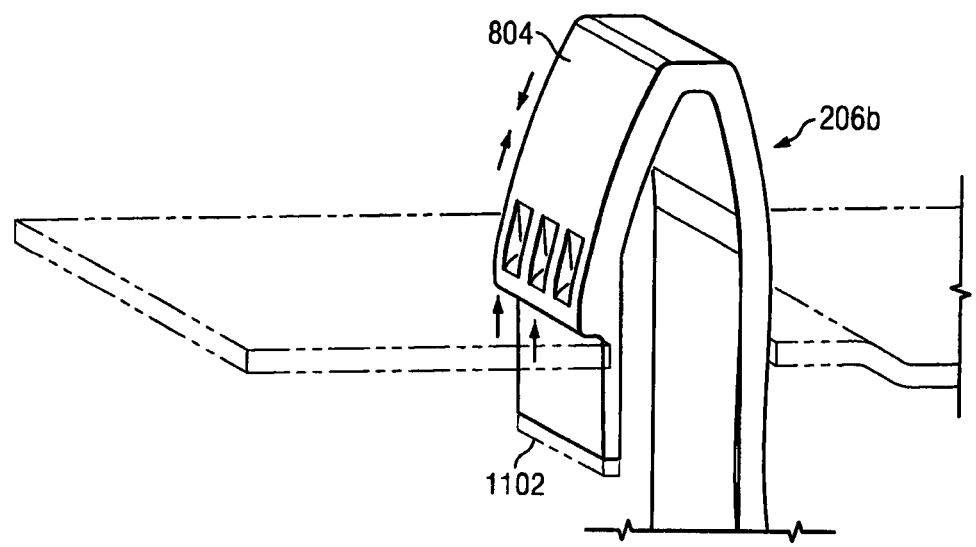

FIGS. 11A-11B are illustrations showing a connection member with an exemplary snap arm 804 in engagement and non-engagement positions, respectively. As shown, the ridge feature 806 of the snap arm 804 is extended into an opening of the adaptor member 300, thereby enabling the snap arm 804 to displace from a compressed position 1102 to a non-compressed position 1104. Removal forces are applied from the adaptor member 300 vertically into the ridge feature 806 of the snap arm 804. FIG. 11B is an illustration of the snap arm in the compressed position 1102. In the compressed position 1102, compression forces, the strongest property of the material of the snap arm 206b, are continuously applied to return the snap arm 804 to the non-compressed position 1104 (FIG. 11A), thereby causing the snap arm 206b to remain engaged with the adaptor member 300.

Figure 12:
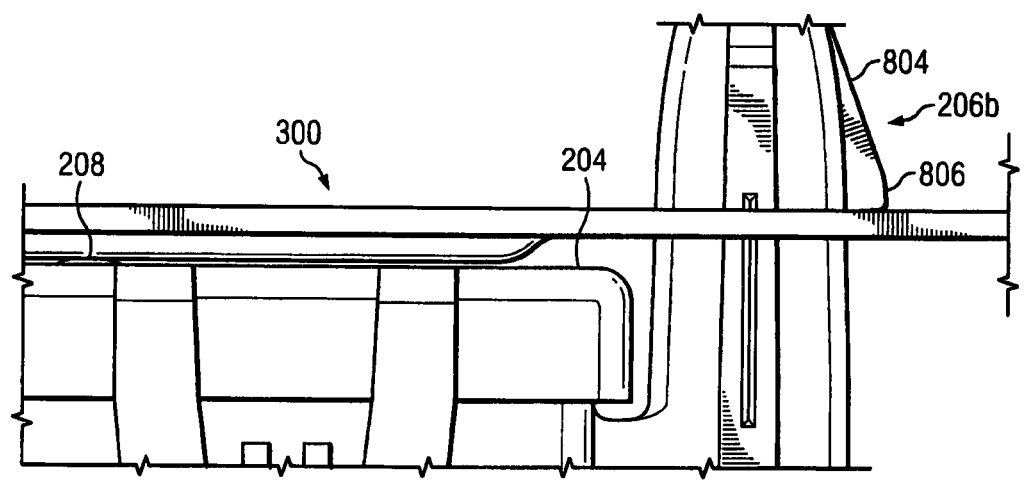
FIG. 12 is an illustration of the housing lid having stand-off bump features in contact with an adaptor member in accordance with the principles of the present invention.

FIG. 12 is an illustration of the housing lid having stand-off bump feature(s) 208 in contact with adaptor member 300 in accordance with the principles of the present invention. The standoff bump feature(s) 208 contact the adaptor member 300 when the connection member 206b extends through an opening of the adaptor member 300 such that the ridge feature 806 interferes with the connection member releasing from the adaptor member 300. The standoff bump feature(s) 208 are designed to provide isolated positive feedback against the adaptor member 300. That is, the standoff bump feature(s) 208 maintain a positive contact between the adaptor member 300 and snap ridge feature 806 of the snap arm 804. Moreover, the standoff bump feature(s) 208 each provide a single point contact feedback mechanism between the snap arm 804 and the adaptor member 300. The small surface area of the standoff bump feature(s) 208 permit the housing lid 204 to flex, thereby allowing for a greater interference to be included in the design. The standoff bump feature(s) 208 may be tooled in a "steel-safe" manner so that a one time adjustment after the housing "first-offs" have been received from a manufacturer to allow for optimal interference to be achieved at minimal cost. It should be understood that the standoff bump feature(s) 208 may be part of the housing lid 204, separate elements from the housing lid 204 that are connected to the housing lid via a fastener or adhesive, or part of the adaptor member 300. In other words, there are several techniques for providing the functionality of the housing lid 204 to be flexible and protect electronics contained within the housing. Still yet, the standoff bump feature(s) 208 may be any shape or size that provides the same or similar functionality as described above.

Figure 13:
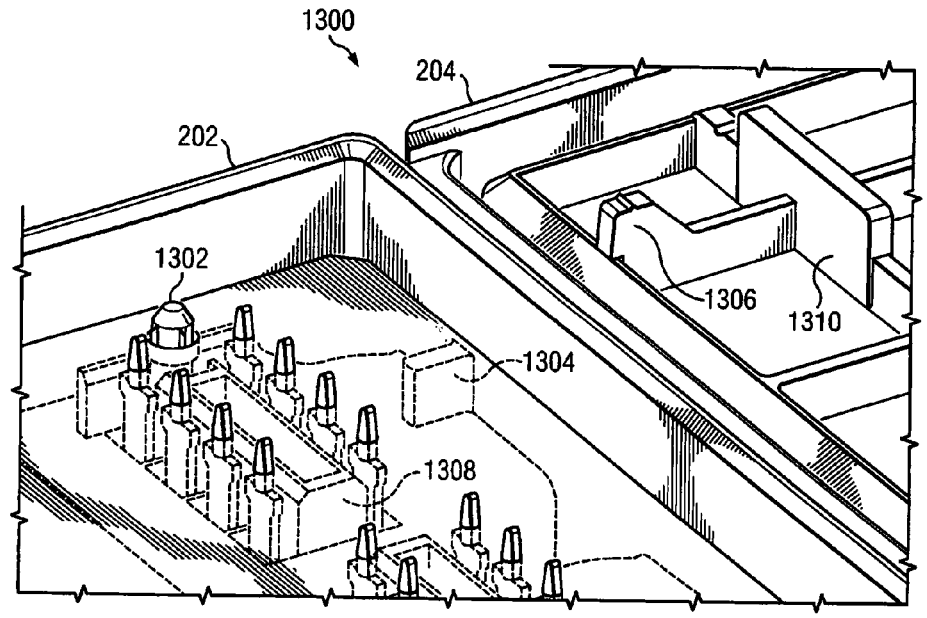
FIG. 13 is an illustration of internal features of the housing configured to receive and protect electronics of a control module.

FIG. 13 is an illustration of internal features 1300 of the housing configured to receive and protect electronics of a control module. The internal features 1300 of the housing base 202 may include one or more align posts 1302 that includes crush-ribs for aligning a printed circuit board (PCB) and prevent transverse motion of the PCB. To take advantage of the alignment posts 1302, a corresponding PCB may include a hole for the primary location and a slot for secondary location, thereby allowing for deviation in the post location. Lower support ribs 1304 provide primary vertical movement support for a PCB. Secondary vertical movement support is provided by upper support ribs 1306 that project from the housing lid 204. There maybe one or more (e.g., four) upper support ribs 1306 that are configured as interference fit crush-ribs to substantially eliminate PCB vibration within the housing. The lower and upper support ribs 1304 and 1306 are aligned such that when the housing lid is closed, the PCB is compressed between the lower and upper support ribs 1304 and 1306 without warping the PCB.

The internal features 1300 further include a connector removal support 1308 that protects against forces applied from removal of a connector and also act as a pin lead-in during PCB insertion. A connector insertion support 1310 further protects against forces applied from connector insertion. Other internal features to prevent damage to the electronics components may be included in the housing, as understood in the art.

Figure 14A:
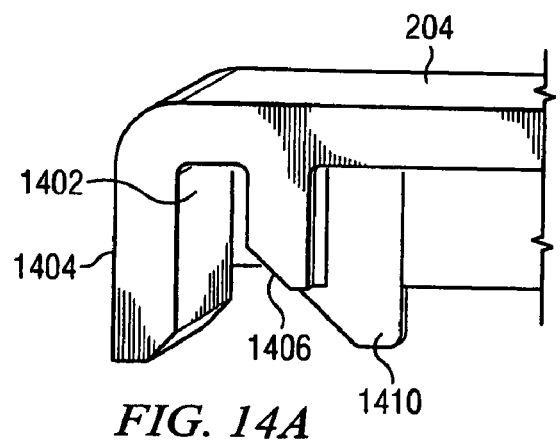
FIGS. 14A-14C are illustrations of a housing lid and housing base configured with a U-channel and U-channel receptor, respectively, for substantially preventing water from entering the housing.
Figure 14B:
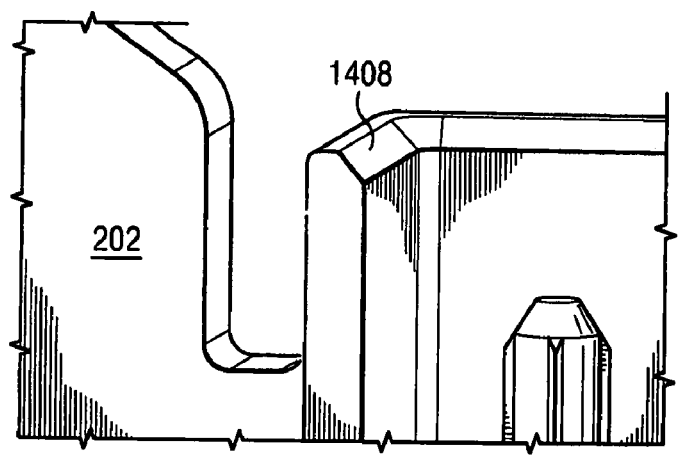
Figure 14C:
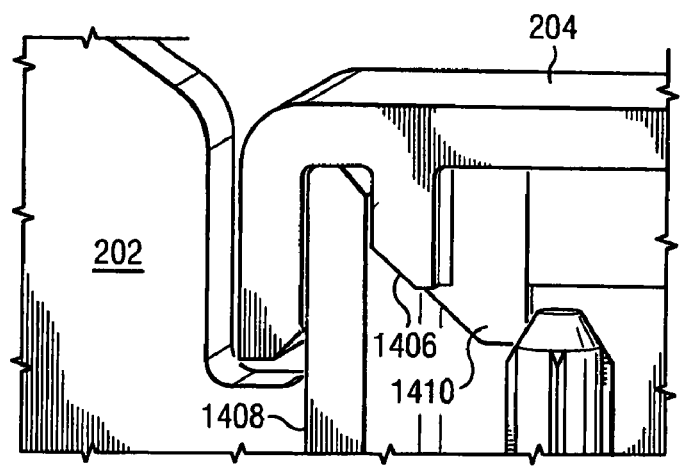

FIGS. 14A-14C are illustrations of a housing lid 204 and housing base 202 configured with a U-channel and U-channel receptor, respectively, for substantially preventing water from entering the housing. In one embodiment, the housing lid 204 may define a U-channel 1402 formed between a first structural element 1404 and second structural element 1406, which may be formed by the same material. One or both of the structural elements 1404 and 1406 may include a chamfered end to provide for alignment with at least one reciprocal structural element 1408 in the housing base 202, as shown in FIG. 14B. In addition, a lead-in rib 1410 may be included as part of the housing lid 204 to provide for guidance during installation and to reduce vibration between the housing lid 204 and housing base 202. FIG. 14C is an illustration of the housing lid 204 being mated to the housing base 202 and the reciprocal structural element 1408 extending into the U-channel 1502 formed between the first and second structural elements 1404 and 1406. The U-channel design discourages capillary action, thereby substantially preventing water from entering the housing. Although not shown, an o-ring or other seal mechanism may be utilized with the U-channel design to make the housing substantially waterproof.

Figure 15:
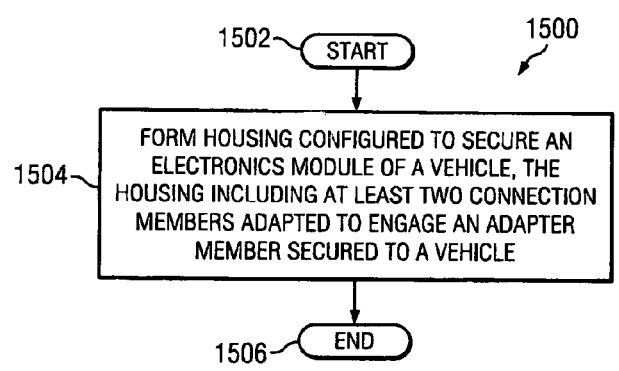
FIG. 15 is a flow diagram of an exemplary process for manufacturing a housing in accordance with the principles of the present invention.

FIG. 15 is a flow diagram of an exemplary process 1500 for manufacturing a housing in accordance with the principles of the present invention. The manufacturing process 1500 starts at step 1502. At step 1504, a housing configured to secure an electronics module of a vehicle is formed. The housing may include at least two connection members adapted to engage an adaptor member secured to a vehicle. In one embodiment, the housing is formed of a housing base and a housing lid. The housing base and housing lid may be formed of a single piece of plastic or other material an include a hinge disposed therebetween. The process 1500 ends at step 1508.

The previous detailed description of a small number of embodiments for implementing the invention is not intended to be limiting in scope. One of skill in this art will immediately envisage the methods and variations used to implement this invention in other areas than those described in detail. The following claims set forth a number of the embodiments of the invention disclosed with greater particularity.

What is claimed:

1. A housing unit for housing an electronics module of a vehicle, said housing comprising:
    a housing configured to secure electronics of an electronics module of the vehicle;
    a first connection member disposed on one side of the housing, the first connection member having a bent planar tabular member extending distally from the housing for being rotatably insertable into a first opening in an adaptor member configured to be secured to the vehicle; and
    a second connection member disposed on an opposite side of the housing, the second connection member having a compressible tabular mechanism extending distally in the same direction as the planar tabular member for inserting and securing into a second opening in the adaptor member.

2. The housing unit according to claim 1, wherein the first connection member configured to insert into the first opening includes at least one protrusion configured to contact the adaptor member to substantially eliminate transverse movement of said housing.

3. The housing unit according to claim 1, wherein the compressible tabular mechanism includes at least one snap arm having a snap feature configured to engage the adaptor member.

4. The housing unit according to claim 3, wherein the at least one snap arm includes a lever arm including a snap, the lever arm configured to enable the snap to disengage from the adaptor member by being pressed.

5. The housing unit according to claim 3, wherein the at least one snap arm includes at least one protrusion disposed thereon to contact the adaptor member to substantially eliminate movement of said housing.

6. The housing unit according to claim 1, wherein said housing includes a housing base and a housing lid.

7. The housing unit according to claim 1, wherein the first opening is configured to engage the first connection member having a first geometric shape and the second opening is configured to engage the second connection member having a second geometric shape, the respective configurations of the first geometric shape of the first connection member and the second geometric shape of the second connection member causing the first connection member to enter the first opening prior to the second connection member entering the second opening to connect the housing unit to the adapter member.

8. A housing unit for housing an electronics module of a vehicle, said housing comprising:
    a housing configured to secure electronics of an electronics module of the vehicle;
    a first connection member disposed on one side of the housing, the first connection member having a bent planar tabular member extending distally from the housing for being rotatably insertable into a first opening in an adaptor member configured to be secured to the vehicle; wherein the first connection member configured to insert into the first opening includes at least one protrusion configured to contact the adaptor member to substantially eliminate transverse movement of said housing, wherein the at least one protrusion includes a crush-rib; and
    a second connection member disposed on an opposite side of the housing, the second connection member having a compressible tabular mechanism extending distally in the same direction as the planar tabular member for inserting and securing into a second opening in the adaptor member.

9. A housing unit for housing an electronics module of a vehicle, said housing comprising:
    a housing configured to secure electronics of an electronics module of the vehicle;
    a first connection member disposed on one side of the housing, the first connection member having a bent planar tabular member extending distally from the housing for being rotatably insertable into a first opening in an adaptor member configured to be secured to the vehicle;
    at least one compressible stand-off bump feature located between the housing and the adaptor member, the compressible stand-off bump feature being compressed for providing vibration dampening when the housing is secured to the adaptor member; and
    a second connection member disposed on an opposite side of the housing, the second connection member having a compressible tabular mechanism extending distally in the same direction as the planar tabular member for inserting and securing into a second opening in the adaptor member.

10. The system unit according to claim 9, wherein the at least one compressible stand-off bump feature contacts the adaptor member when the first and second connection members engage the adaptor member.

11. A method of manufacturing a housing unit for an electronics module for a vehicle, said method comprising:
    forming a housing configured to secure an electronics module of a vehicle, the housing including a first connection member disposed on one side of the housing, the first connection member having a bent planar tabular member extending distally from the housing for being rotatably inserted into a first opening in an adaptor member configured to be secured to the vehicle; and a second connection member disposed on an opposite side of the housing, the second connection member having a compressible tabular mechanism extending distally in the same direction as the planar tabular member for inserting and securing into a second opening in the adaptor member.

12. The method according to claim 11, wherein forming the housing includes forming the first connection member and second connection member to include at least one connection member to hook into the adaptor member.

13. The method according to claim 12, wherein forming the at least one connection member includes forming at least one protrusion configured to contact the adaptor member to substantially eliminate transverse movement of the housing when the housing is engaged to the adapter member.

14. The method according to claim 11, wherein forming the housing includes forming the compressible tabular mechanism to include at least one snap arm having a snap feature configured to engage the adaptor member.

15. The method according to claim 14, wherein forming the at least one snap arm includes forming a lever arm configured to enable the snap arm to disengage from the adaptor member by being pressed.

16. The method according to claim 14, wherein forming the at least one snap arm includes forming at least one protrusion disposed thereon to contact the adaptor member to substantially eliminate vibration of the housing with respect to the adapter member.

17. The method according to claim 11, wherein forming the housing includes forming a housing base and a housing lid.

18. The method according to claim 17, wherein forming the housing base and housing lid includes forming a hinge integrally connecting the housing base and housing lid.

19. The method according to claim 11, wherein the first connection member and second connection member are configured to cause the first connection member to engage the first opening defined by the adaptor member prior to the second connection member engaging the second opening defined by the adaptor member to connect the housing and the adaptor member.

20. A method of manufacturing a housing unit for an electronics module for a vehicle, said method comprising:
forming a housing configured to secure an electronics module of a vehicle, the housing including a first connection member disposed on one side of the housing, the first connection member having a bent planar tabular member extending distally from the housing for being rotatably inserted into a first opening in an adaptor member configured to be secured to the vehicle; and a second connection member disposed on an opposite side of the housing, the second connection member having a compressible tabular mechanism extending distally in the same direction as the planar tabular member for inserting and securing into a second opening in the adaptor member, wherein forming the first or second connection member includes forming at least one protrusion having a crushed-rib, the at least one protrusion configured to contact the adaptor member to substantially eliminate transverse movement of the housing when the housing is engaged to the adapter member.

21. A method of manufacturing a housing unit for an electronics module for a vehicle, said method comprising:
forming a housing configured to secure an electronics module of a vehicle, the housing including a first connection member disposed on one side of the housing, the first connection member having a bent planar tabular member extending distally from the housing for being rotatably inserted into a first opening in an adaptor member configured to be secured to the vehicle; a second connection member disposed on an opposite side of the housing, the second connection member having a compressible tabular mechanism extending distally in the same direction as the planar tabular member for inserting and securing into a second opening in the adaptor member; and at least one compressible stand-off bump feature.

22. The method according to claim 21, wherein forming the at least one compressible stand-off bump feature on the housing is performed to cause the at least one stand-off bump feature to contact the adaptor member when the at least two connection members engage the adaptor member.

23. A method for securing an electronics housing unit to a vehicle, said method comprising:
connecting an adapter member to the vehicle, the adapter member defining a first opening and a second opening;
inserting a first connection member of a housing into the first opening defined by the adapter member to engage the first connection member with the adapter member, the first connection member having a bent planar tabular member extending distally from the housing for being rotatably inserted into the first opening in the adapter member;
rotating the housing about the first connection member; and
inserting a second connection member of the housing into the second opening to engage the second connection member with the adapter, the second connection member having a compressible tabular mechanism extending distally in the same direction as the planar tabular member for inserting and securing into the second opening in the adaptor member.

24. The method according to claim 23, wherein inserting the second connection member into the second opening is performed until the second connection member snaps into the second opening, thereby preventing the housing and adapter member from being disconnected without the second connection member being disengaged from the adapter member.

25. The method according to claim 23, further comprising pressing a portion of the second connection member to disengage the second connection member from the adapter member.

* * * * *